(12) United States Patent
Reusch et al.

(10) Patent No.: US 9,035,417 B2
(45) Date of Patent: May 19, 2015

(54) PARASITIC INDUCTANCE REDUCTION FOR MULTILAYERED BOARD LAYOUT DESIGNS WITH SEMICONDUCTOR DEVICES

(71) Applicant: Efficient Power Conversion Corporation, El Segundo, CA (US)

(72) Inventors: David Reusch, Blacksburg, VA (US); Johan Tjeerd Strydom, Santa Clara, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 14/142,257

(22) Filed: Dec. 27, 2013

(65) Prior Publication Data
US 2014/0183550 A1   Jul. 3, 2014

Related U.S. Application Data

(60) Provisional application No. 61/747,668, filed on Dec. 31, 2012.

(51) Int. Cl.
| | | |
|---|---|---|
| H01L 23/528 | (2006.01) | |
| H01L 23/538 | (2006.01) | |
| H01L 27/13 | (2006.01) | |
| H01L 27/06 | (2006.01) | |
| H02M 7/00 | (2006.01) | |
| H01L 23/498 | (2006.01) | |

(52) U.S. Cl.
CPC ........... *H01L 27/0629* (2013.01); *H02M 7/003* (2013.01); *H01L 2924/0002* (2013.01); *H01L 2924/15192* (2013.01); *H01L 23/49822* (2013.01)

(58) Field of Classification Search
None
See application file for complete search history.

(56) References Cited

U.S. PATENT DOCUMENTS

| | | | |
|---|---|---|---|
| 6,252,177 B1 * | 6/2001 | Stoddard | 174/260 |
| 7,968,391 B1 | 6/2011 | Smart et al. | |
| 2006/0164811 A1 | 7/2006 | Maxwell et al. | |
| 2008/0230258 A1 | 9/2008 | Shen et al. | |
| 2011/0032052 A1 | 2/2011 | Chen et al. | |
| 2011/0154659 A1 * | 6/2011 | Britton et al. | 29/840 |
| 2014/0183550 A1 * | 7/2014 | Reusch et al. | 257/76 |

OTHER PUBLICATIONS

"RF Design Guidelines PCB Layout and Circuit Optimization", dated Nov. 27, 2013 and downloaded from URL< http://www.semtech.com/images/datasheet/rf_design_guidelines_ag.pdf> on Sep. 19, 2014.*
Wayback History for "RF Design Guidelines PCB Layout and Circuit Optimization", dated Nov. 27, 2013 and downloaded from URL< http://www.semtech.com/images/datasheet/rf_design_guide-lines_ag.pdf> on Sep. 19, 2014.*
International Search Report for PCT/US2013/077667.*

* cited by examiner

*Primary Examiner* — Joseph Schoenholtz
(74) *Attorney, Agent, or Firm* — Dickstein Shapiro LLP

(57) ABSTRACT

A highly efficient, single sided circuit board layout design providing magnetic field self-cancellation and reduced parasitic inductance independent of board thickness. The low profile power loop extends through active and passive devices on the top layer of the circuit board, with vias connecting the power loop to a return path in an inner layer of the board. The magnetic effect of the portion of the power loop on the top layer is reduced by locating the inner layer return path directly underneath the power loop path on the top layer.

10 Claims, 13 Drawing Sheets

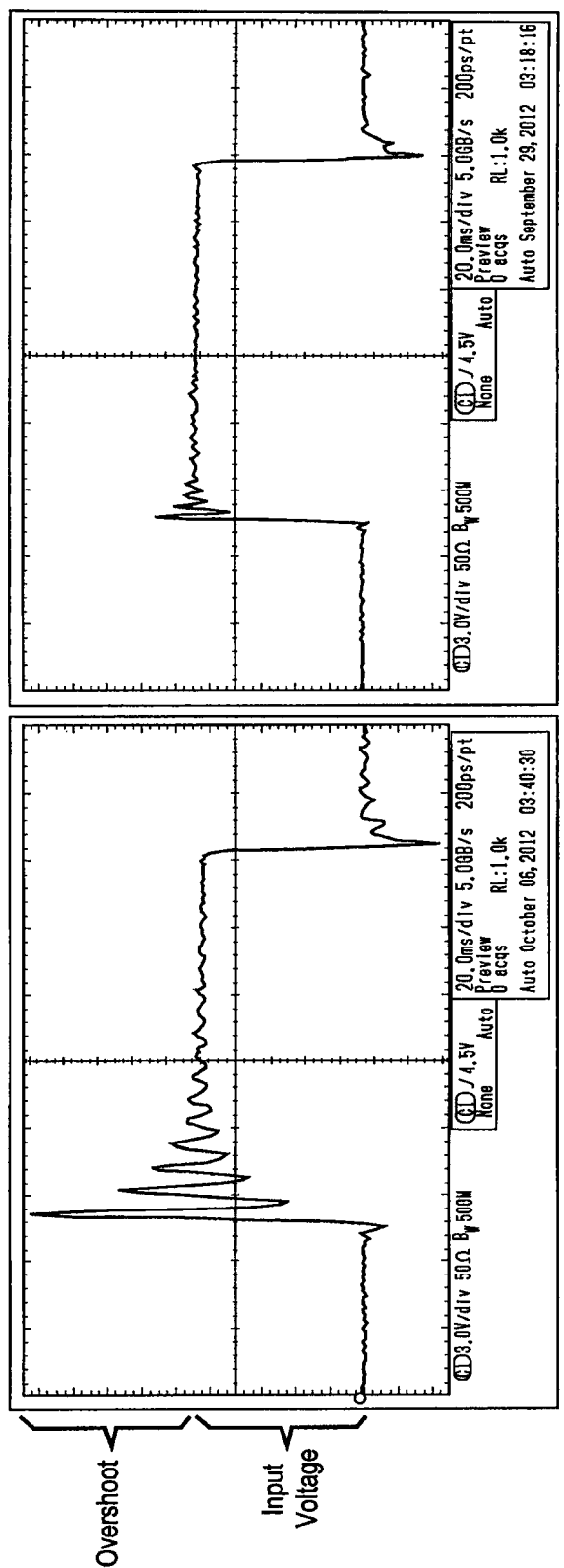

PARASITIC INDUCTANCE REDUCTION FOR MULTILAYERED BOARD LAYOUT DESIGNS WITH SEMICONDUCTOR DEVICES

BACKGROUND OF THE INVENTION

1. Field of the Invention

The present invention relates generally to power converters and circuits, e.g., circuit boards and, more particularly, to circuit board layouts for improving power converter performance.

2. Description of the Related Art

The improvement of power field effect transistor (FET) technologies such as silicon metal oxide semiconductor FETs and the introduction of gallium nitride (GaN) based transistors allow switching power supplies to achieve faster switching speeds by reducing switching related charges and package parasitic inductance. With higher switching speeds and lower package parasitic inductance, the circuit board layout of converter components becomes a limiting factor in converter performance because the layout of components has a significant effect on the overall level of parasitic inductance. An improved circuit board layout is needed to minimize the high frequency loop inductance in a multilayer circuit board design and improve converter performance.

High frequency power loop inductance, controlled by circuit board layout, is a major contributor to loss of power converter efficiency. Consequently, the layout of the devices and high frequency bus capacitors is critical to high frequency performance. To verify the relationship between loop inductance and efficiency loss, different layouts with similar common source inductances and different loop inductances were compared. FIG. 1 is a graph charting the impact of high frequency power loop inductance on power converter efficiency for an eGaN® FET design at 1 MHz. Specifically, as shown in FIG. 1, an increase in the high frequency loop inductance from approximately 0.4 nH to approximately 2.9 nH resulted in a decrease in efficiency by over 4%.

Another impact of the faster switching speeds provided by lower figure of merit devices is an increase in voltage overshoot when compared to devices with slower switching speeds. Decreasing the high frequency loop inductance results in lower voltage overshoot, increased input voltage capability, and reduced electromagnetic interference. FIG. 2A and FIG. 2B depict drain to source voltage waveforms of a synchronous rectifier for designs with high frequency loop inductances of 1.6 nH and 0.4 nH, respectively. As shown in FIGS. 2A and 2B, a decrease in high frequency loop inductance from 1.6 nH (FIG. 2A) to 0.4 nH (FIG. 2B) results in a 75% decrease in voltage overshoot.

Conventionally, two circuit board layouts have been employed to minimize the high frequency loop inductance as described below in connection with FIGS. 3A-3B and 4A-4C. In the first conventional layout design, illustrated in FIGS. 3A and 3B, high frequency bus capacitors and devices are arranged on a top layer of the circuit board. The high frequency power loop for this design is disposed on a top layer of the circuit board and is considered a lateral power loop because the loop flows parallel to the board plane on a single layer. In this design, an inductor connection is created through internal layers by using vias located between a top switch and a synchronous rectifier. A driver is located in close proximity to the eGaN® FETs to minimize and stabilize the common source inductance.

FIGS. 3A and 3B depict the part placement of an eGaN® FET design resulting in a lateral high frequency power loop 302. In this design, capacitors 303 and eGaN® FETs 306, 307 are located on a top layer 305 of a circuit board 310. A power loop current 302 flows through the capacitors 303 and the eGaN® FETs 306, 307. An inductor connection is created through internal layers by using vias 311 extending between the top switch 306 and synchronous rectifier 307. A driver 308 is located in close proximity to the eGaN® FETs 306, 307 to minimize and stabilize the common source inductance.

While minimizing the physical size of the loop is important to reduce parasitic inductance, the design of inner layers is also critical. For the lateral power loop design, illustrated in FIG. 3B, a first inner layer serves as a "shield layer" 309. The shield layer 309 has a critical role to shield the circuit from magnetic fields generated by the high frequency power loop 302. To perform this shielding function, the high frequency power loop 302 generates a magnetic field that induces a current, opposite in direction to the power loop current, within the shield layer 309. The current induced in the shield layer 309 generates a magnetic field of opposite polarity to the magnetic field of the power loop. The magnetic fields created within the shield layer 309 and the power loop 302 neutralize each other translating into a reduction in parasitic inductance.

The lateral power loop design provides advantages and disadvantages. For example, the level of high frequency loop inductance should show little dependence on board thickness since the power loop is located on the top layer 305. The lateral power loop design's lack of dependence on board thickness allows for thicker board design. On the other hand, the level of loop inductance in this design is likely very dependent on the distance from the power loop to the shield layer. This dependence on distance limits the thickness of a top layer 305. The shield layer also contributes additional conductive losses to the power converter, decreasing performance.

In the second conventional layout design illustrated in FIGS. 4A-4C, the high frequency bus capacitors and devices are disposed on opposite sides of a circuit board, with capacitors generally being located directly underneath the devices to minimize physical loop size. This layout creates a vertical power loop because the power loop travels perpendicular to the board plane through vias which complete the power loop through the board.

FIGS. 4A-4C depict an eGaN® FET design resulting in a vertical high frequency power loop 400. In this design, eGaN® FETs 401, 408 are arranged on a top layer 402 of a circuit board 403 and capacitors 404 are arranged on a bottom layer 405 of the circuit board 403. High frequency power loop current 406 flows through the eGaN® FETs 401, 408 located on the top layer 402 of the circuit board 403. The loop current 406 then flows through vias 409 and through the capacitors 404 located on the bottom layer 405 of the circuit board 403. The current 406 then flows back to the eGaN® FETs 401, 408 through vias 410. Space 407 is left between the eGaN® FETs 401, 408 to allow for inductor connection.

The FIGS. 4A-4C eGaN® FET design does not contain a shield layer due to the vertical structure of the power loop. As opposed to the use of a shield plane to reduce loop inductance, the vertical power loop uses a magnetic field self-cancellation method to reduce inductance. For the circuit board layout, the board thickness is generally much thinner than the horizontal length of the power loop paths on the top and bottom side of the board. As the thickness of the board decreases, the area of the vertical power loop shrinks significantly when compared to the lateral power loop, and the current flowing in opposing directions on the top and bottom layers begins to provide magnetic field self-cancellation, further reducing parasitic inductance. Accordingly, the board thickness must be minimized in this design to create an effective vertical power loop.

Like the lateral power loop design illustrated in FIGS. 3A-3B, the vertical power loop design also has advantages and disadvantages. For example, the distance between the first inner layer and top layer has little impact on the loop inductance. Therefore, the thickness of the top layer does not significantly affect the level of loop inductance. On the other hand, the level of loop inductance is heavily dependent on the overall board thickness because the power loop paths are located on the top and bottom layers of the CIRCUIT BOARD.

Accordingly, a semiconductor device layout for minimizing parasitic inductance and improving converter performance is desired.

SUMMARY OF THE INVENTION

The present invention provides a circuit board layout design which eliminates the above-noted disadvantages of the prior art designs. Specifically, the circuit board of the present invention comprises a top layer, a bottom layer, and at least one inner layer connected by vias to the top layer so that a high frequency power loop is formed in a path extending between the top layer and the inner layer. Advantageously, the layout design according to the present invention minimizes parasitic inductance independent of board thickness and without requiring a shield layer.

BRIEF DESCRIPTION OF THE DRAWINGS

The features, objects, and advantages of the present disclosure will become more apparent from the detailed description set forth below when taken in conjunction with the drawings in which like reference characters identify correspondingly elements and in which:

FIGS. 2A and 2B are waveforms showing the voltage overshoot of a synchronous rectifier with an inductance of 1.6 nH and 0.4 nH, respectively.

DETAILED DESCRIPTION OF THE PREFERRED EMBODIMENT

In the following detailed description, reference is made to certain embodiments. These embodiments are described with sufficient detail to enable those skilled in the art to practice them. It is to be understood that other embodiments may be employed and that various structural, logical, and electrical changes may be made.

The circuit board layout designs of the present invention described below provide reduced loop size, magnetic field self-cancellation, consistent inductance independent of board thickness, and a single sided circuit board design providing high efficiency for a multi-layer structure. The circuit board layout design of the present invention utilizes the first inner layer as a power loop return path. This return path is located directly underneath the power loop of the top loop, allowing for the smallest physical loop size combined with magnetic field self-cancellation.

While embodiments described herein are described in connection with certain types of devices, specifically gallium nitride ("GaN") devices, and, more specifically, GaN transistors, it should be understood that the invention is not so limited. For example, the described embodiments may be applicable to transistor devices and other types of semiconductor devices that use different conductive materials, such as, for example, silicon (Si) or silicon-containing materials, grapheme, germanium (Ge), gallium arsenide (GaAs). Described embodiments are also applicable to other types of semiconductor devices, such as other field effect transistor (FET)-type semiconductor devices, bipolar junction transistor (BJT) devices, and insulated-gate bipolar transistor (IGBT) devices. The described concepts are also equally applicable to both enhancement mode and depletion mode transistor devices. In addition, while specific embodiments are described in connection with paralleled switching devices and switching circuits, it should be understood that features described herein are generally applicable to other types of circuits, such as RF amplifiers, switching converters, other power converters and other circuits.

Figure 1:
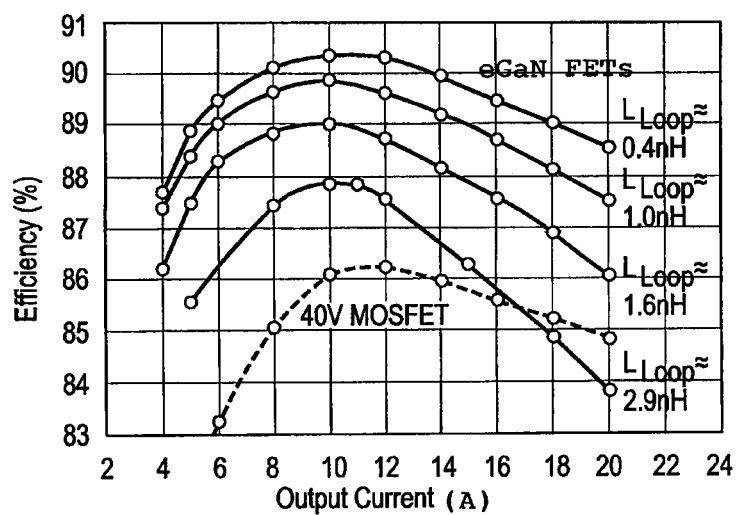
FIG. 1 is a line graph illustrating the impact of high frequency loop inductance on efficiency of designs with similar common source inductance.
Figure 3A:
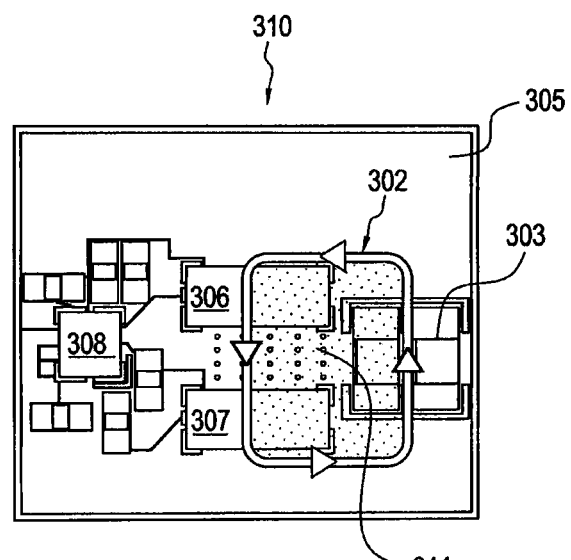
FIGS. 3A and 3B are top and side views, respectively, of a CIRCUIT BOARD having a conventional lateral power loop.
Figure 3B:
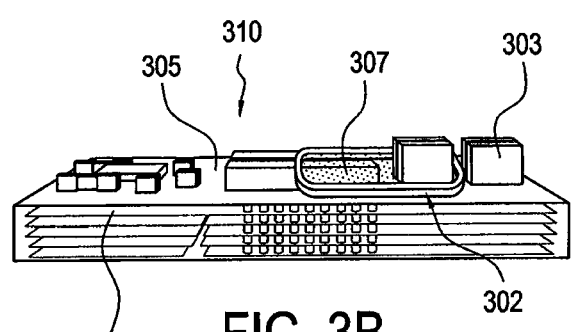
Figure 4A:
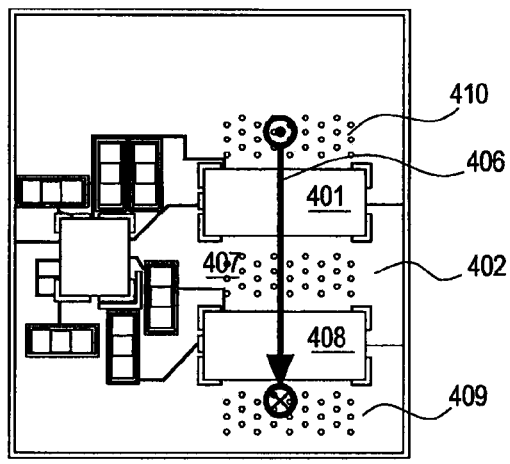
FIGS. 4A, 4B, and 4C are top, bottom, and side views, respectively, of a circuit board having a conventional vertical power loop.
Figure 4B:
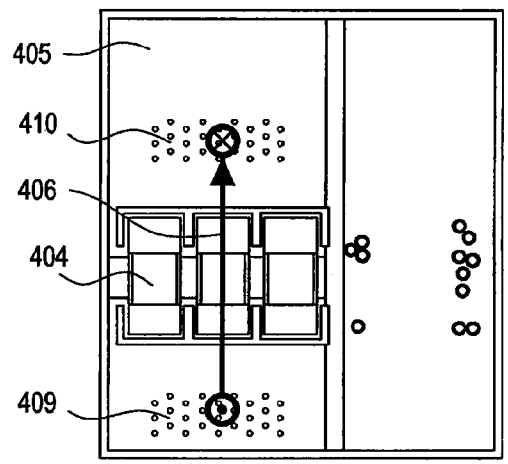
Figure 4C:
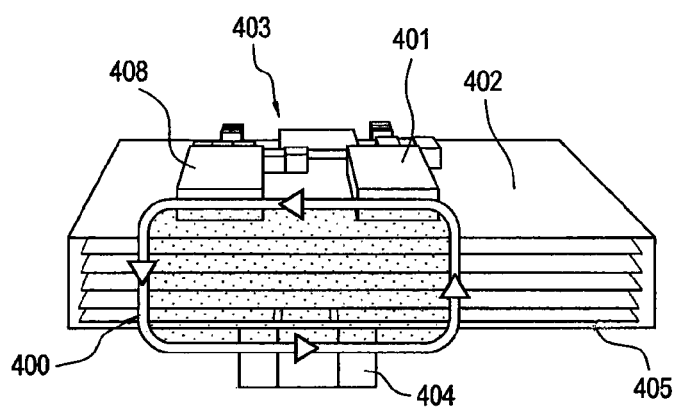
Figure 5A:
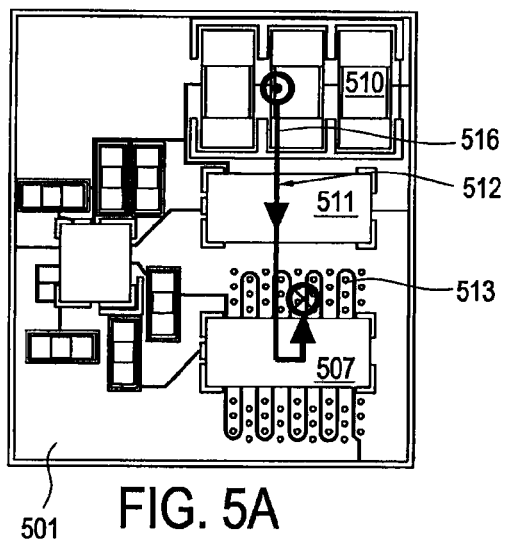
FIGS. 5A and 5B are top views of the top layer and the first inner layer, respectively, of the circuit board layout of a first embodiment of the present invention.
Figure 5B:
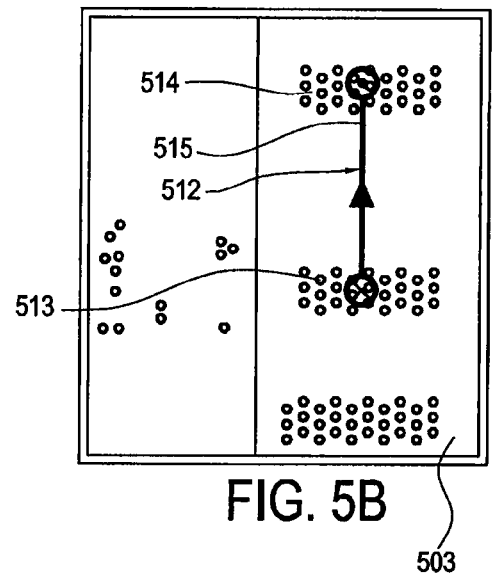
Figure 5C:
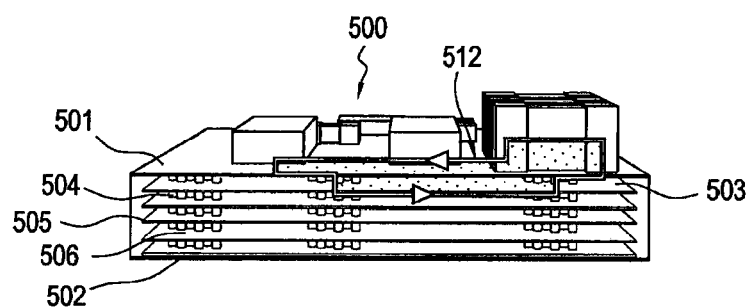
FIG. 5C is a side view of the circuit board layout of the first embodiment.

FIGS. 5A, 5B, and 5C illustrate simplified schematic diagrams of an exemplary multilayer circuit board design 500 according to an embodiment of the present invention. In this embodiment, the circuit board design 500 contains a top layer 501, a bottom layer 502, and four inner layers 503-506 including a first inner layer 503. Although four inner layers are shown, fewer or additional inner layers may be included.

Capacitors 510 and eGaN® FETs 507, 511 are located on the top layer 501. FIG. 5A is a top view of the circuit board design 500 showing a power loop current path 516 on the top layer 501 of the circuit board 500. The power loop current 512 flows directly from the capacitors 510, through the eGaN® FET 507 and then through eGaN® FET 511 and finally to a portion of the interleaved inductor node and ground vias 513 of the eGaN® FETs 507, 511, which are used to connect the top layer 501 to the first inner layer 503, which is adjacent to the top layer 501. The first inner layer 503 is utilized as a return path for the power loop current 512 by connecting the portion of the eGaN® FET's vias 513 to at least a portion of the capacitors' 510 vias 514.

FIG. 5B is a top view of the first inner layer 503, used as a return path 515 for the power loop current path 512. Return path portion 515 of the power loop path 512 may be located directly underneath at least a portion of the top layer's 501 power loop path 516, allowing for the smallest physical loop size combined with magnetic field self-cancellation.

FIG. 5C is a side view of the low profile magnetic field self-cancelling loop of an exemplary multilayer circuit board design 500. The distance between the first inner layer 503 and the top layer 501 is preferably between 1 mil and 20 mil. FIG. 5C shows the current flow of a circuit board layout with a negative capacitor node, but the invention can also be implemented with a positive capacitor node having the opposite current flow.

Figure 6A:
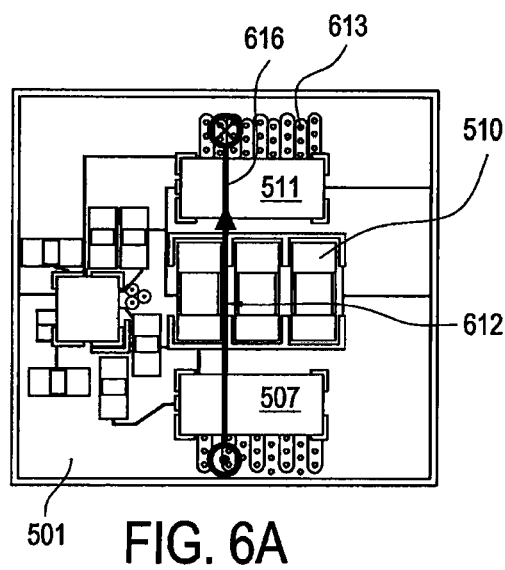
FIGS. 6A and 6B are top views of the top layer and the first inner layer, respectively, of the circuit board layout of a second embodiment of the present invention with a capacitor between two switches.
Figure 6B:
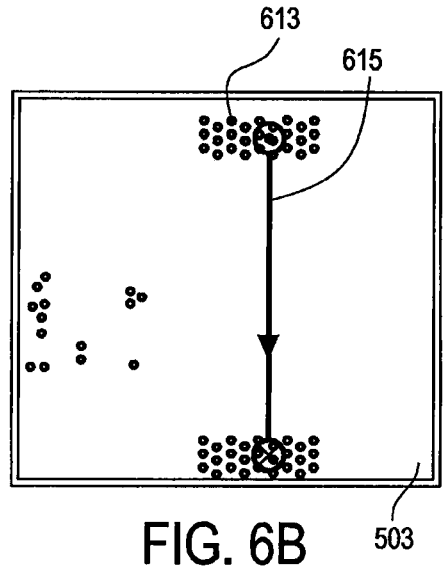
Figure 6C:
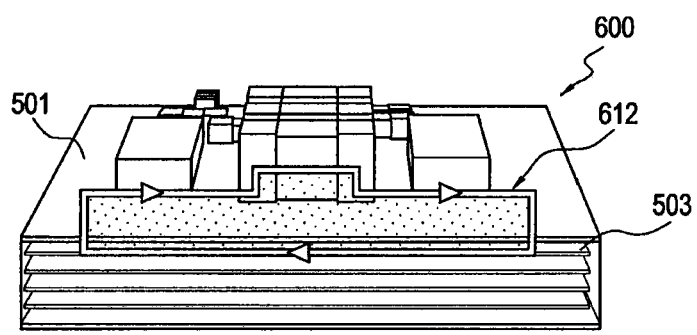
FIG. 6C shows a side view of the circuit board layout of the second embodiment.

FIGS. 6A, 6B, and 6C illustrate an exemplary multilayer circuit board design 600 according to another embodiment of the present invention. In this embodiment, capacitors 510 are located between the two eGaN® FETs 507, 511. FIG. 6A is a top view of the circuit board design 600, with a power loop current path 616 on the top layer 501 of the circuit board 600. The power loop current 612 flows from one eGaN® FET 507, through the capacitors 510, and another eGaN® FET 511, to the first inner layer 503 through vias 613 that connect the top layer 501 to the first inner layer 503. As shown in FIG. 6B, the first inner layer 503 is utilized as a return path 615 for the power loop. FIG. 6C is a side view of the low profile self-cancelling loop of an exemplary multilayer design 600. As shown, the magnetic effect of the power loop path 616 of the top layer is self-cancelled by the return path 615 underneath the top layer 501.

Table I compares the electrical characteristics of the conventional layout designs (FIGS. 3A-3B and 4A-4C) and the optimized layout design of the present invention (FIGS. 5A-5C). The optimized layout design shares the traits of the lateral power loop by showing little dependence on board thickness and a strong dependence on inner layer distance. Additionally, the embodiment of FIGS. 5A-5C shares the traits of the vertical power loop by removing the shield layer and reducing the physical size of the power loop which translates into a significant reduction in loop inductance. By combining the strengths of both conventional designs, and limiting the weaknesses, the proposed layout design can provide a reduction in inductance on the order of 65% compared to the conventional lateral or vertical power loops (FIGS. 3A-3B and 4A-4C).

TABLE I

| Electrical characteristic | Lateral Loop (FIGS. 3A-3B) | Vertical Loop (FIGS. 4A-4C) | Optimal Loop (FIGS. 5A-5C) |
| --- | --- | --- | --- |
| Single Sided Board Capability | Yes | No | Yes |

TABLE I-continued

| Electrical characteristic | Lateral Loop (FIGS. 3A-3B) | Vertical Loop (FIGS. 4A-4C) | Optimal Loop (FIGS. 5A-5C) |
| --- | --- | --- | --- |
| Magnetic Field Self Cancellation | No | Yes | Yes |
| Inductance Independent of Board Thickness | Yes | No | Yes |
| Shield Layer Required | Yes | No | No |

Figure 7:
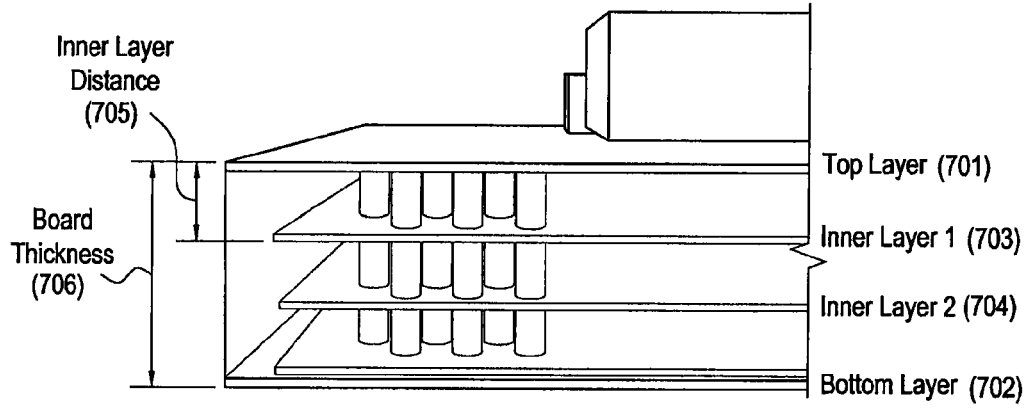
FIG. 7 is a cross sectional drawing of a multilayer board design of a circuit board identifying board thickness and inner layer distance.

To compare the performance of the FIGS. 5A-5C embodiment with conventional lateral (FIGS. 3A-3B) and vertical (FIGS. 4A-4C) layout designs for a wide range of applications, twelve different test circuit board designs, four different boards for each of the three layouts, were created and tested. The four types of test boards varied the overall thickness of the board and the distance between the top layer and the first inner layer within the board. These board parameters are defined by illustration in FIG. 7, where a first inner layer 703 and a second inner layer 704 are disposed between a top layer 701 and bottom layer 704. Inner layer distance 705 is the distance between the top layer 701 and the first inner layer 703. Board thickness 706 is the distance between the top layer 701 and the bottom layer 702. The specifications for the test boards are contained in Table II below.

TABLE II

|  | Board Thickness (mil) | Inner Layer Distance (mil) |
| --- | --- | --- |
| Test Board 1 | 31 | 4 |
| Test Board 2 | 31 | 12 |
| Test Board 3 | 62 | 4 |
| Test Board 4 | 62 | 26 |

Figure 8:
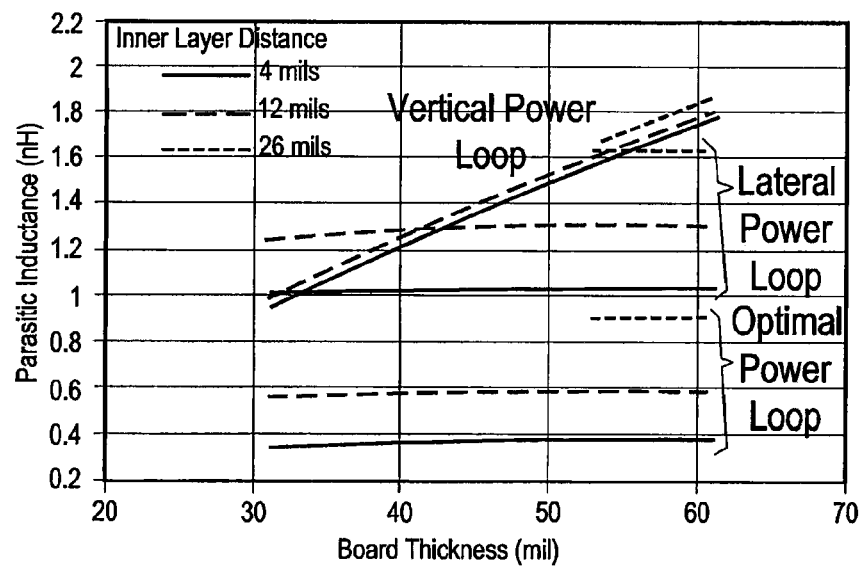
FIG. 8 is a graph showing simulated high frequency loop inductance values for lateral, vertical, and optimal power loops with different board thickness and inner layer distance.

FIG. 8 shows the values of the high frequency loop inductance for the twelve test circuit board designs. The data shows that for the lateral power loop, the board thickness has little impact on the high frequency loop inductance while the inner layer distance, the distance from the power loop to the shield layer, significantly impacts the inductance. In contrast, the data shows that for the vertical power loop, the inner layer distance has very little impact on the inductance of the design, while the board thickness significantly increases the inductance by as much as 80% when the board thickness is doubled. As also shown, the parasitic inductance of optimal power loop is lower than lateral power loop and vertical power loop. The board thickness has little impact on optimal power loop, and the parasitic inductance of optimal power loop of inner layer distance of 26 mil is lower than lateral power loop of inner layer distance of 4 mil.

Figure 9:
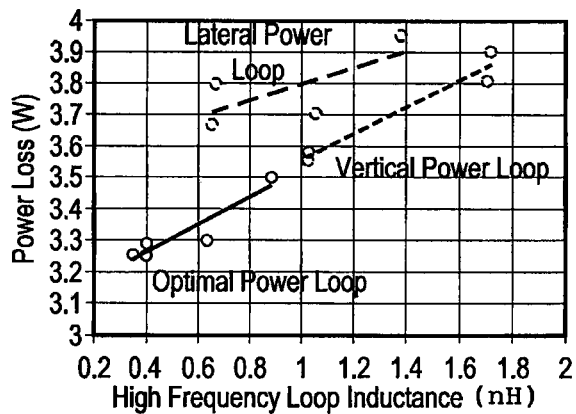
FIG. 9 is a power loss plot of the prior art lateral and vertical power loop designs, and the optimal power loop design of the present invention.

FIG. 9 illustrates the power loss for the twelve test circuit board designs. This data shows that for similar parasitic inductances, the power loss of the lateral loop is higher than the power loss of the vertical loop. The higher power loss in the lateral loop is attributed to loss caused by the addition of the shield layer, a layer not required in the vertical or optimal power loop. The data also shows that for similar parasitic inductances, the power loss of the optimal power loop is lower than both the lateral power loop and the vertical power loop.

Figure 10:
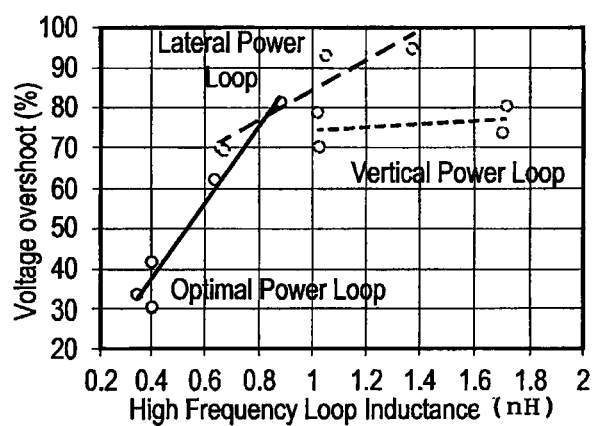
FIG. 10 is a chart showing measured voltage overshoots for the lateral, vertical, and optimal power loop designs.

FIG. 10 shows the voltage overshoot for the twelve test circuit board designs. As loop inductance increases toward 1.4 nH, the voltage overshoot increases. Once the loop inductance increases over 1.4 nH, the voltage overshoot does not significantly increase further for this given example. The data shows that for similar parasitic inductances, the voltage overshoot of the lateral power loop is higher than vertical power loop. Also, the voltage overshoot of the optimal loop is lower than lateral power loop in general.

Figure 11:
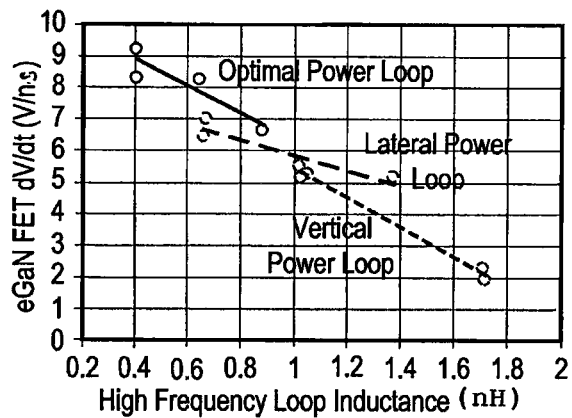
FIG. 11 is a chart showing the effect of a loop inductance on switching speed.

FIG. 11 partially explains this change in voltage overshoot by showing the measured switching speed of the twelve test circuit board designs. As the loop inductance increases, the dV/dt of the device decreases significantly for lateral power loop, vertical power loop, and optimal power loop. This decrease results in higher power loss but a more limited voltage overshoot. For the two vertical loop designs with the highest loop inductance, the switching speed is reduced over 60% when compared to the remaining designs.

Figure 12:
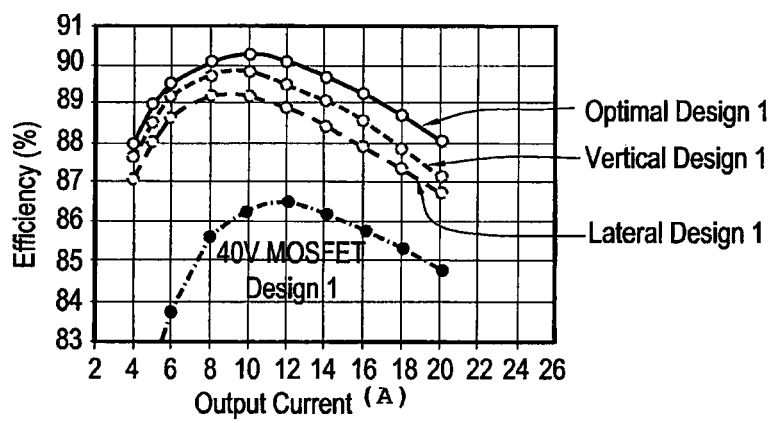
FIG. 12 is a chart showing the improved efficiency of the circuit board layout design of the present invention as compared to the prior art vertical and lateral loop designs.

FIG. 12 shows the efficiency results of Design 1 for the optimal power loop, vertical power loop, and lateral power loop compared to a Si MOSFET implementation utilizing a vertical power loop with the smallest commercial package, a 3×3 mm TSDSON-8, to minimize the size of the power loop. For the Si MOSFET design, the high frequency loop inductance was measured to be around 2 nH, compared to 1 nH for a similar power loop using eGaN® FETs. The high level of inductance present in the Si MOSFET design is due to the large packaging inductance of the Si MOSFET. As a result of the superior figure of merit and packaging of the eGaN® FETs, all of the eGaN® FET power loop designs outperform the Si MOSFET benchmark design. Using the proposed optimal power loop design, the efficiency can be improved 3% full load and 4% peak efficiency by using the eGaN® FETs instead of the Si MOSFET.

The optimal power loop described in connection with the FIGS. 5A-5C embodiment provides a 0.8% and 1% full load efficiency improvement over the conventional vertical and lateral power loop designs, respectively. In addition, the FIGS. 5A-5C embodiment provides greater power efficiency and lower device voltage overshoot compared to conventional devices with lateral and vertical power loops.

Figure 13:
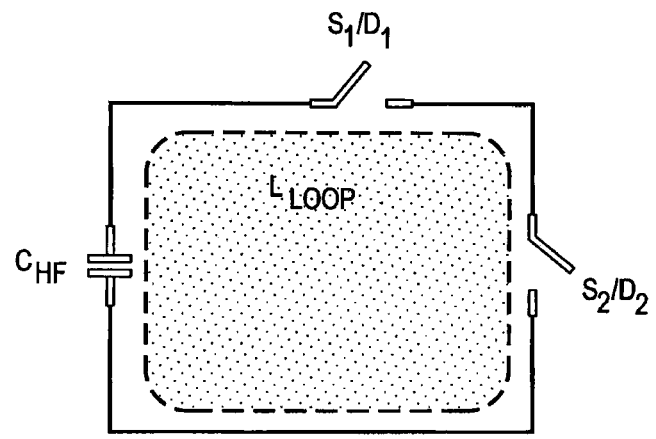
FIG. 13 shows the power loop topology of a basic unit cell of the present invention.

FIG. 13 shows the power loop topology of a basic unit cell of the present invention. As has been noted, the optimal loop of the present invention can be formed on any of the multiple inner layers. Additionally, the length of the path may change according to the location of vias connecting the top layer of a circuit board to inner layers. The physical size of the power loop $L_{Loop}$ may also change by forming the power loop in different inner layers. Accordingly, various low-profile circuits with the optimal loop of the present invention can be designed.

FIGS. 14-20 show implementations of the optimal loop of the present invention in various circuits design. It should be noted that the present invention is not limited to these topologies. For example, two (or more) devices can be monolithically integrated into one package. Put another way, all of the devices shown in FIGS. 13-20 can each be a separate discrete device or some (or all) can be integrated into a single package. The present invention can therefore be implemented as a monolithic integrated solution or as a hybrid integrated structure.

Figure 14:
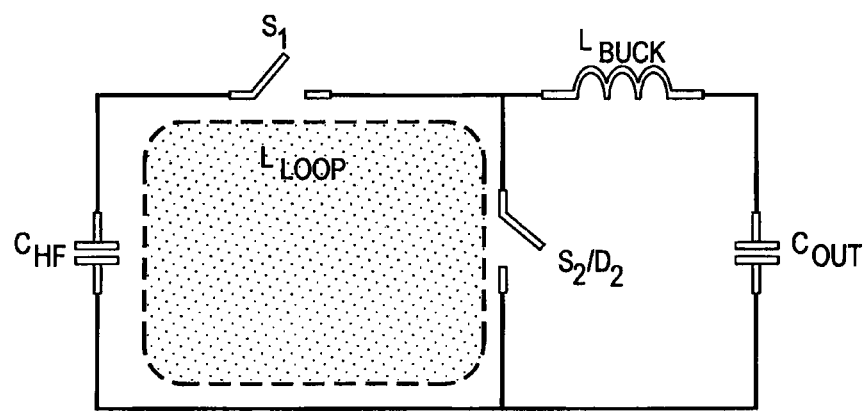
FIG. 14 shows the topology of a buck converter incorporating the optimal loop of the present invention.
Figure 15:
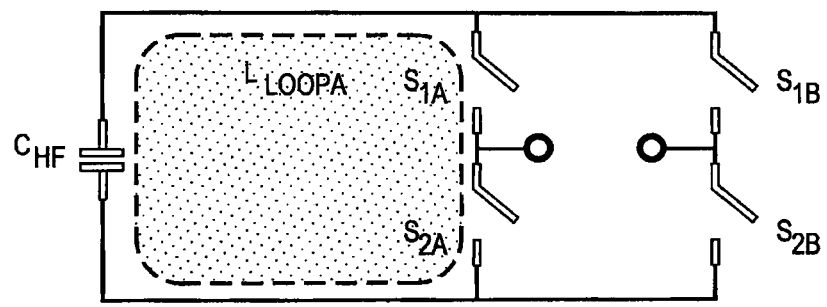
FIGS. 15 and 16 show the topology of a bridge converter incorporating the optimal loop of the present invention.
Figure 16:
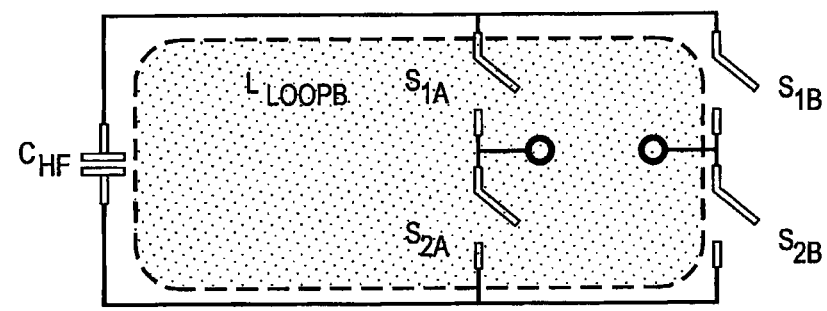

FIG. 14 shows the topology of an exemplary buck converter incorporating the optimal loop of the present invention. FIGS. 15 and 16 show the topology of a bridge converter incorporating the optimal loop of the present invention. As described above, the physical size of the optimal loop may change depending on the location of vias connecting the top layer of a circuit board to inner layers or the location of the inner layer where the optimal loop is formed.

Figure 17:
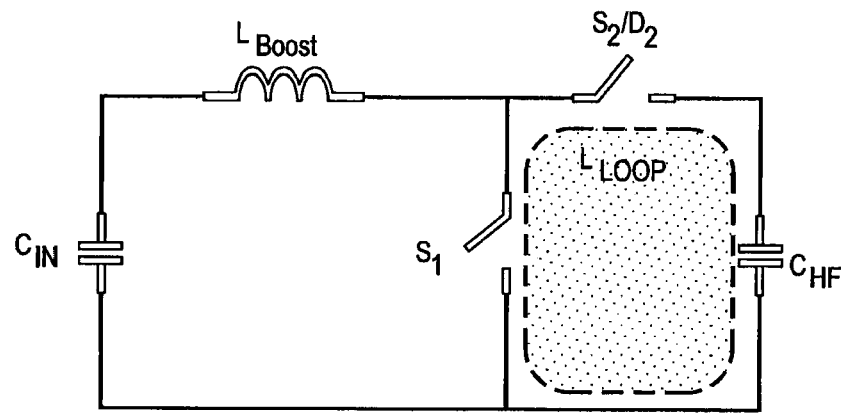
FIG. 17 shows the topology of a boost circuit unit cell (with a boost inductor and a capacitor) incorporating the optimal loop of the present invention.
Figure 18:
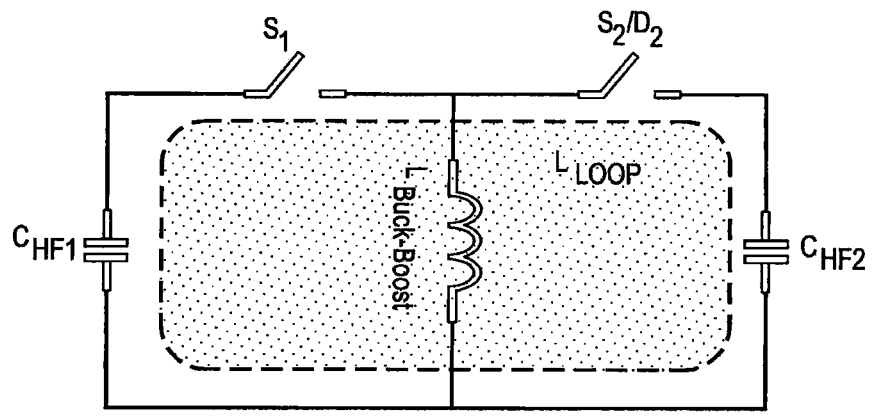
FIG. 18 shows the topology of a buck-boost converter incorporating the optimal loop of the present invention.
Figure 19:
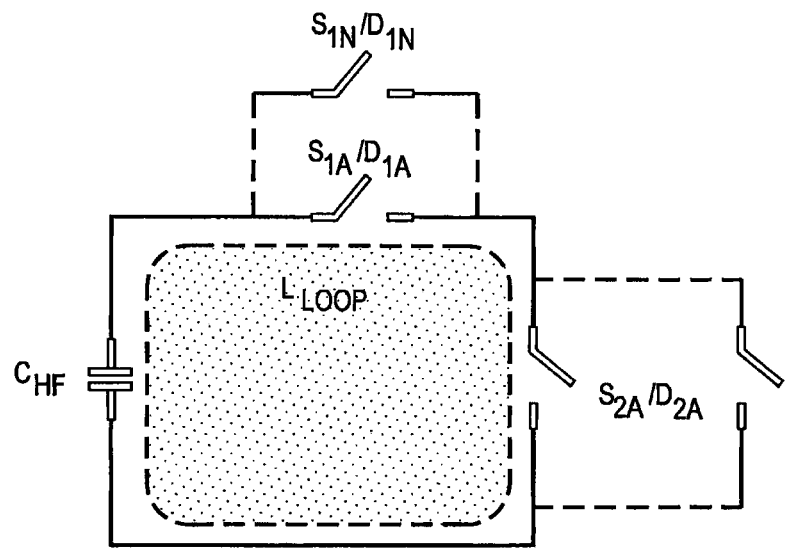
FIG. 19 shows a parallel arrangement of switches in a circuit incorporating the optimal loop of the present invention.
Figure 20:
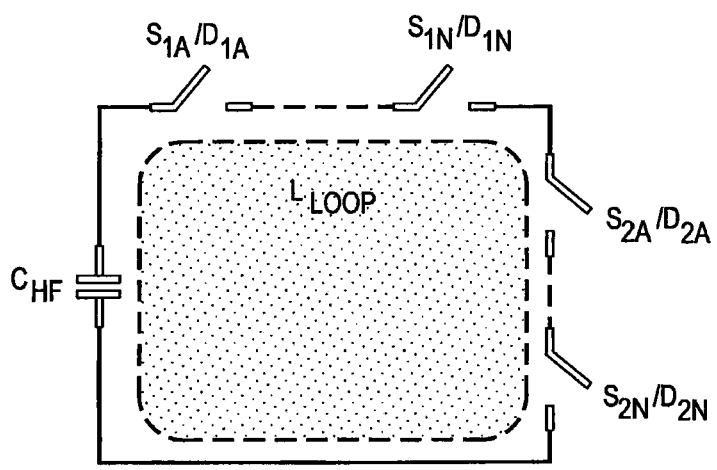
FIG. 20 shows a series arrangement of switches in a circuit incorporating the optimal loop of the present invention.

FIG. 17 shows the topology of a boost circuit unit cell with a boost inductor $L_{Boost}$ and a capacitor $C_{in}$ incorporating the optimal loop of the present invention. FIG. 18 shows the topology of a buck-boost convertor incorporating the optimal loop of the present invention. As has been noted, the physical size of the power loop $L_{Loop}$ can change according to the specific need of the circuit incorporating the optimal loop of the present invention. Furthermore, as shown in FIGS. 19 and 20, in the circuit incorporating the optimal loop of the present invention, the switches can be arranged in parallel or in series, respectively, or a combination of both.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A circuit board for circuits including at least one capacitor and a plurality of transistors, the circuit board comprising:
   a top layer on which the capacitor and the plurality of transistors are mounted, with the top layer having a first direct electrical connection between the capacitor and only one of the transistors and a second direct electrical connection between the plurality of transistors to form part of a high frequency power loop, the top layer further including at least one first via electrically connected to the capacitor and at least one second via electrically connected to one of the plurality of transistors;
   a bottom layer; and
   a plurality of an inner layers disposed between the top layer and the bottom layer with the at least one first via and the at least one second via each extending therethrough,
   wherein one of the inner layer defines a return path to complete the high frequency power loop by electrically connecting the at least one first via to the at least one second via.

2. The circuit board of claim 1, wherein the return path of the inner layer is located so as to reduce the magnetic effect of the high frequency power loop of the top layer.

3. The circuit board of claim 1, wherein the return path defined by the inner layer is located directly underneath the path of the high frequency power loop of the top layer.

4. The circuit board of claim 1, wherein the plurality of transistors are a GaN transistor.

5. The circuit board of claim 1, wherein the capacitor forms a switching circuit with the plurality of transistors.

6. The circuit board of claim 1, wherein the capacitor and the plurality of transistors are components of a switching circuit.

7. The circuit board of claim 1, wherein the capacitor and the plurality of transistors are components of a power converter.

8. The circuit board of claim 1, wherein the capacitor and the plurality of transistors are components of a RF amplifier.

9. The circuit board of claim 1, wherein the at least one first via is disposed under the capacitor and at least one second via is disposed under the one transistor of the plurality of transistors.

10. The circuit board of claim 1, wherein the inner layer that defines the return path by electrically connecting the at least one first via to the at least one second via is the inner layer adjacent to the top layer.

* * * * *